(12) United States Patent
Lohmann et al.

(10) Patent No.: US 9,620,823 B2
(45) Date of Patent: Apr. 11, 2017

(54) ELECTROCHEMICAL CELL WITH MAGNETIC SENSOR

(71) Applicant: Robert Bosch GmbH, Stuttgart (DE)

(72) Inventors: Timm Lohmann, Mountain View, CA (US); Bernd Schumann, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 300 days.

(21) Appl. No.: 14/471,425

(22) Filed: Aug. 28, 2014

(65) Prior Publication Data

US 2015/0061602 A1 Mar. 5, 2015

Related U.S. Application Data

(60) Provisional application No. 61/872,237, filed on Aug. 30, 2013.

(51) Int. Cl.
| | |
|---|---|
| *G01N 27/416* | (2006.01) |
| *H01M 10/48* | (2006.01) |
| *H02J 7/00* | (2006.01) |
| *G01R 31/36* | (2006.01) |
| *G01R 33/09* | (2006.01) |
| *H01M 10/42* | (2006.01) |
| *H01M 10/052* | (2010.01) |

(52) U.S. Cl.
CPC ........ *H01M 10/48* (2013.01); *G01R 31/3606* (2013.01); *G01R 33/093* (2013.01); *H02J 7/0063* (2013.01); *G01R 31/3679* (2013.01); *H01M 10/052* (2013.01); *H01M 2010/4271* (2013.01)

(58) Field of Classification Search
CPC .................................................... H01M 10/48

USPC ......................................................... 324/426
See application file for complete search history.

(56) References Cited

U.S. PATENT DOCUMENTS

2013/0057288 A1   3/2013 Ogata et al.

FOREIGN PATENT DOCUMENTS

| JP | 2002008631 A | 1/2002 |
|---|---|---|
| JP | 2005183142 A | 7/2005 |
| WO | 2013027945 A2 | 2/2013 |

OTHER PUBLICATIONS

International Search Report and Written Opinion corresponding to PCT Application No. PCT/US2014/053174, mailed Dec. 3, 2014 (10 pages).
Baker, W. J. et al., "Robust Absolute Magnetometry with Organic Thin-Film Devices", Nature Communications, 2012, vol. 3. Article No. 898, pp. 1-7 (7 pages).

(Continued)

*Primary Examiner* — Edward Tso
*Assistant Examiner* — Ahmed Omar
(74) *Attorney, Agent, or Firm* — Maginot Moore & Beck LLP

(57) ABSTRACT

In accordance with one embodiment, a battery system includes an electrochemical cell, a flexible sensor assembly attached to the cell, the flexible sensor assembly including an array of spin valve magnetic field sensors exhibiting an organic magneto resistance effect, and a battery management system operably connected to the flexible array, the battery management system including a memory with program instructions stored therein, and a processor operably connected to the memory and to the array, the processor configured to execute the program instructions to identify local changes in magnetic flux using input from the array of magnetic field sensors.

17 Claims, 4 Drawing Sheets

(56) References Cited

OTHER PUBLICATIONS

Amatucci, G. et al., "Fluoride based electrode materials for advanced energy storage devices", Journal of Fluorine Chemistry, 2007. 128(4): p. 243-262.
Cabana, J. et al., "Beyond Intercalation-Based Li-Ion Batteries: the State of the Art and Challenges of Electrode Materials Reacting Through Conversion Reactions", Advanced Energy Materials, 2010. 22(35): p. E170-E192.
USABC Goals for Advanced Batteries for EVs. 2002, United States Advanced Battery Consortium. http://www.uscar.org/commands/files_download.php?files_id=27.
Ohtomo, T. et al., "All solid-state lithium secondary batteries using the 75Li2S-25P2S5 glass an the 70Li2S—30P2S5 glass-ceramic as solid electrolytes", Journal of Power Sources 233 (2013) 231-235.
Wiers et al. "A Solid Lithium Electrolyte via Addition of Lithium Isopropoxide to a Metal-Organic Framework with Open Metal Sites," Journal of American Chemical Society, 2011, 133 (37), pp. 14522-14525.
Christensen et al., "A critical Review of Li/Air Batteries", Journal of the Electrochemical Society 159(2) 2012, R1-R30.
Murugan et al., "Fast Lithium Ion Conduction in Garnet-Type Li7La3Zr2012", Agnew. Chem. Int. Ed. 2007, 46, 7778-7781.
Jee et al., "Characteristics of a new type of solid-state electrolyte with a LiPON interlayer for Li-ion thin film batteries", Solid State Ionics 181 (2010) 902-906.
Kamaya, N. et al., "A lithium superionic conductor," Nature Materials vol. 10, Sep. 2011.

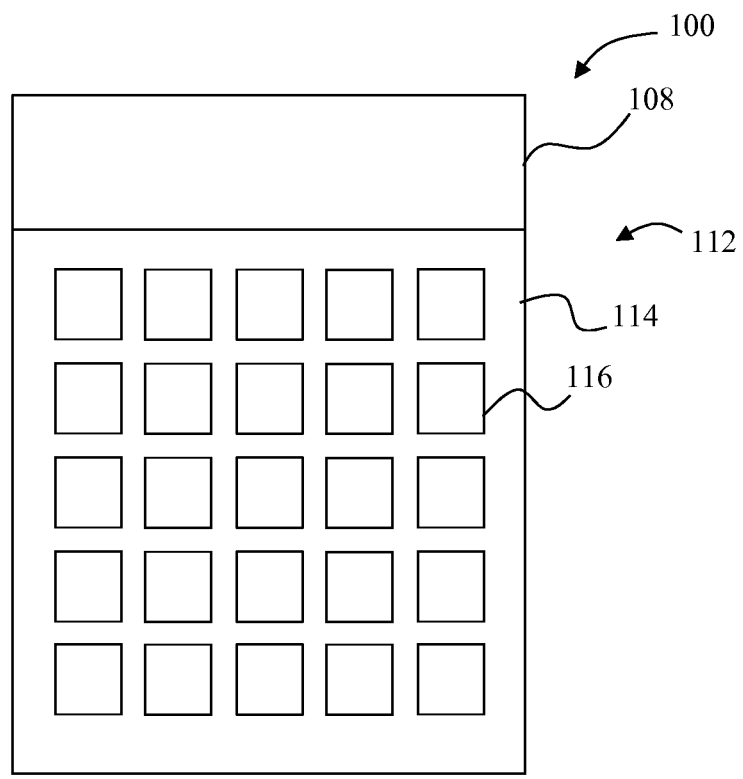
FIG. 2
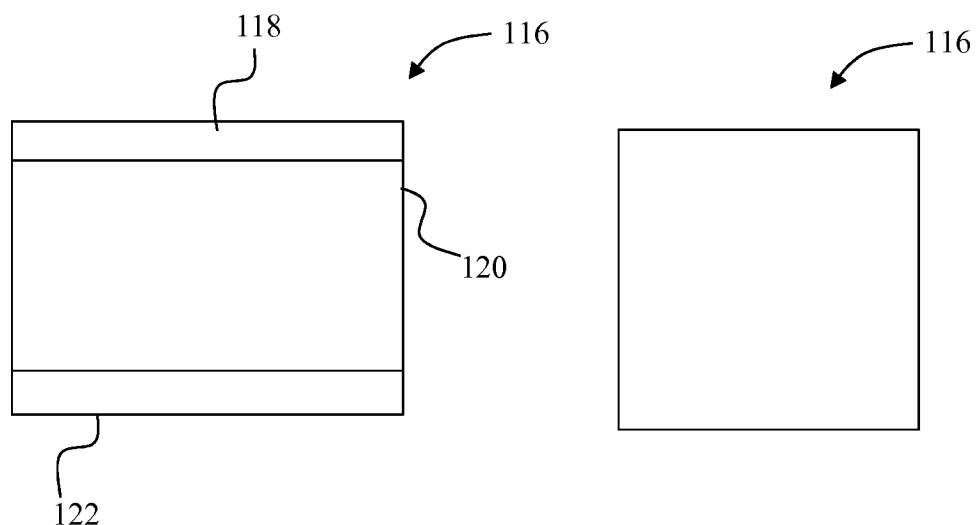
FIG. 3
FIG. 4

ELECTROCHEMICAL CELL WITH MAGNETIC SENSOR

CROSS REFERENCE

This application claims the benefit of U.S. Provisional Application No. 61/872,237 filed Aug. 30, 2013, the entire contents of which is herein incorporated by reference.

FIELD OF THE DISCLOSURE

The present disclosure relates to batteries and electrochemical cells.

BACKGROUND

Batteries are a useful source of stored energy that can be incorporated into a number of systems. Rechargeable lithium-ion ("Li-ion") batteries are attractive energy storage systems for portable electronics and electric and hybrid-electric vehicles because of their high specific energy compared to other electrochemical energy storage devices. In particular, batteries with a form of lithium metal incorporated into the negative electrode afford exceptionally high specific energy (measured in Wh/kg) and energy density (measured in Wh/L) compared to batteries with conventional carbonaceous negative electrodes.

When high-specific-capacity negative electrodes such as lithium are used in a battery, the maximum benefit of the capacity-increase over conventional systems is realized when a high-capacity positive electrode active material is also used. Conventional lithium-intercalating oxides (e.g., $LiCoO_2$, $LiNi_{0.8}Co_{0.15}Al_{0.05}O_2$, and $Li_{1.1}Ni_{0.3}Co_{0.3}Mn_{0.3}O_2$) are typically limited to a theoretical capacity of ~280 mAh/g (based on the mass of the lithiated oxide) and a practical capacity of 180 to 250 mAh/g. In comparison, the specific capacity of lithium metal is about 3863 mAh/g. The highest theoretical capacity achievable for a lithium-ion positive electrode is 1168 mAh/g (based on the mass of the lithiated material), which is shared by $Li_2S$ and $Li_2O_2$. Other high-capacity materials including $BiF_3$ (303 mAh/g, lithiated) and $FeF_3$ (712 mAh/g, lithiated) are identified in Amatucci, G. G. and N. Pereira, *Fluoride based electrode materials for advanced energy storage devices.* Journal of Fluorine Chemistry, 2007. 128(4): p. 243-262. All of the foregoing materials, however, react with lithium at a lower voltage compared to conventional oxide positive electrodes, hence limiting the theoretical specific energy. The theoretical specific energies of the foregoing materials, however, are very high (>800 Wh/kg, compared to a maximum of ~500 Wh/kg for a cell with lithium negative and conventional oxide positive electrodes).

Thus the advantage of using a Li metal negative electrode (sometimes referred to as an anode) is the much higher energy density of the entire cell, as compared to cells with graphitic or other intercalation negative electrode. A disadvantage of using pure Li metal is that lithium is highly reactive. Accordingly, the lithium metal has a propensity to undergo morphology changes, which cause structures having a high surface area to form on and around the negative electrode when the cell is being charged. Exemplary high surface area structures include dendrites and mossy structures.

Dendrites are the most common failure mode for cells with Li metal anodes. The dendrites form with a needle-like structure and can grow through the separator during charging of the cell, resulting in an internal short. "Soft shorts" that burn out rapidly result in a temporary self-discharge of the cell, while "strong shorts" consisting of a higher, more stable contact area can lead to complete discharge of the cell, cell failure, and even thermal runaway. While dendrites typically grow through the separator during charge, shorts can also develop during discharge depending on the external pressure placed on the cell and/or internal volume changes that occur in both the negative and positive electrodes.

Because Li metal is highly electronically conductive, the surface of the Li tends to roughen as the metal is plated and stripped. Peaks in the surface grow as dendrites during charge. During discharge, some smoothing of the dendrites occurs. Nonetheless, there is typically some roughness that remains at the end of discharge. Depending on the depth of discharge, the overall roughness can be amplified from one cycle to the next. Because the metal is essentially at the same electrochemical potential throughout, potential and, to a lesser extent, concentration gradients in the electrolyte phase drive the change in morphology.

Related to dendrite initiation and growth is development of the Li morphology, which tends to increase the electrode surface area with cycling and consumes solvent to generate fresh passivation layers. Formation of high-surface-area mossy Li tends to occur during low-rate deposition from a liquid electrolyte, especially if the salt concentration is high. The high surface area combined with high reactivity of Li and flammability of the organic solvent makes for a very reactive and dangerous cell.

What is therefore needed is an electrochemical cell with a monitoring system which can indicate the onset of potentially catastrophic failure of the electrochemical cell.

SUMMARY

In accordance with one embodiment, a battery system includes an electrochemical cell, a flexible sensor assembly attached to the cell, the flexible sensor assembly including an array of spin valve magnetic field sensors exhibiting an organic magneto resistance effect, and a battery management system operably connected to the flexible array, the battery management system including a memory with program instructions stored therein, and a processor operably connected to the memory and to the array, the processor configured to execute the program instructions to identify local changes in magnetic flux using input from the array of magnetic field sensors.

In one or more embodiments each of the magnetic field sensors includes an organic p-n junction.

In one or more embodiments each of the magnetic field sensors exhibits an organic magneto resistance change (dR/R) of greater than 10%.

In one or more embodiments the flexible sensor assembly includes a flexible substrate, and the flexible substrate is attached to a cathode current collector of the electrochemical cell.

In one or more embodiments the processor is further configured to execute the program instructions to identify local changes in magnetic flux using a matrix ($\bar{\rho}$) of input values from the array of magnetic field sensors.

In one or more embodiments the processor is further configured to execute the program instructions to control operation of the battery based upon the identified local changes in magnetic flux.

In one or more embodiments the processor is further configured to execute the program instructions to determine a state-of-health of the electrochemical cell.

In one or more embodiments the processor is further configured to execute the program instructions to determine the state-of-health of the electrochemical cell by comparing a measured absolute magnetic field distribution to a reference value stored in the memory.

In accordance with one method operating a battery system includes discharging an electrochemical cell, sensing a plurality of discharging localized magnetic fluxes of the electrochemical cell using a flexible sensor assembly having a flexible substrate supporting an array of spin valve magnetic field sensors, each of which exhibit an organic magneto resistance effect, while discharging the cell, analyzing, by executing with a processor command instructions stored in a memory, the sensed plurality of discharging localized magnetic fluxes, and controlling operation of the electrochemical cell by executing with the processor command instructions stored in the memory based upon the analyzed sensed plurality of discharging localized magnetic fluxes.

In one or more embodiments operating a battery system includes storing first data associated with a mapping of a plurality of initial localized magnetic fluxes of an electrochemical cell, wherein analyzing includes comparing the first data with data associated with the sensed plurality of discharging localized magnetic fluxes.

In one or more embodiments sensing the plurality of discharging localized magnetic fluxes includes sensing the plurality of discharging localized magnetic fluxes using an array of spin valve magnetic field sensors including organic p-n junctions.

In one or more embodiments sensing the plurality of discharging localized magnetic fluxes includes sensing the plurality of discharging localized magnetic fluxes using an array of spin valve magnetic field sensors exhibiting an organic magneto resistance change (dR/R) of greater than 10%.

In one or more embodiments sensing the plurality of discharging localized magnetic fluxes includes sensing the plurality of discharging localized magnetic fluxes using an array of spin valve magnetic field sensors supported by a flexible substrate attached to a cathode current collector of the electrochemical cell.

In one or more embodiments analyzing the sensed plurality of discharging localized magnetic fluxes includes executing the program instructions with the processor to identify local changes in magnetic flux using a matrix $(\bar{\rho})$ of input values from the array of spin valve magnetic field sensors.

In one or more embodiments operating a battery system includes determining a state of health of the electrochemical cell using the analyzed sensed plurality of discharging localized magnetic fluxes by executing with the processor command instructions stored in the memory.

In one or more embodiments determining the state of health includes comparing the first data with data associated with the sensed plurality of discharging localized magnetic fluxes.

BRIEF DESCRIPTION OF THE DRAWINGS

FIG. 2 depicts a side plan view of the system of FIG. 1;

FIG. 3 depicts a side plan view of a sensor used in the monitoring system of FIG. 1;

FIG. 4 depicts a top plan view of the sensor of FIG. 3;

DESCRIPTION

Figure 1:
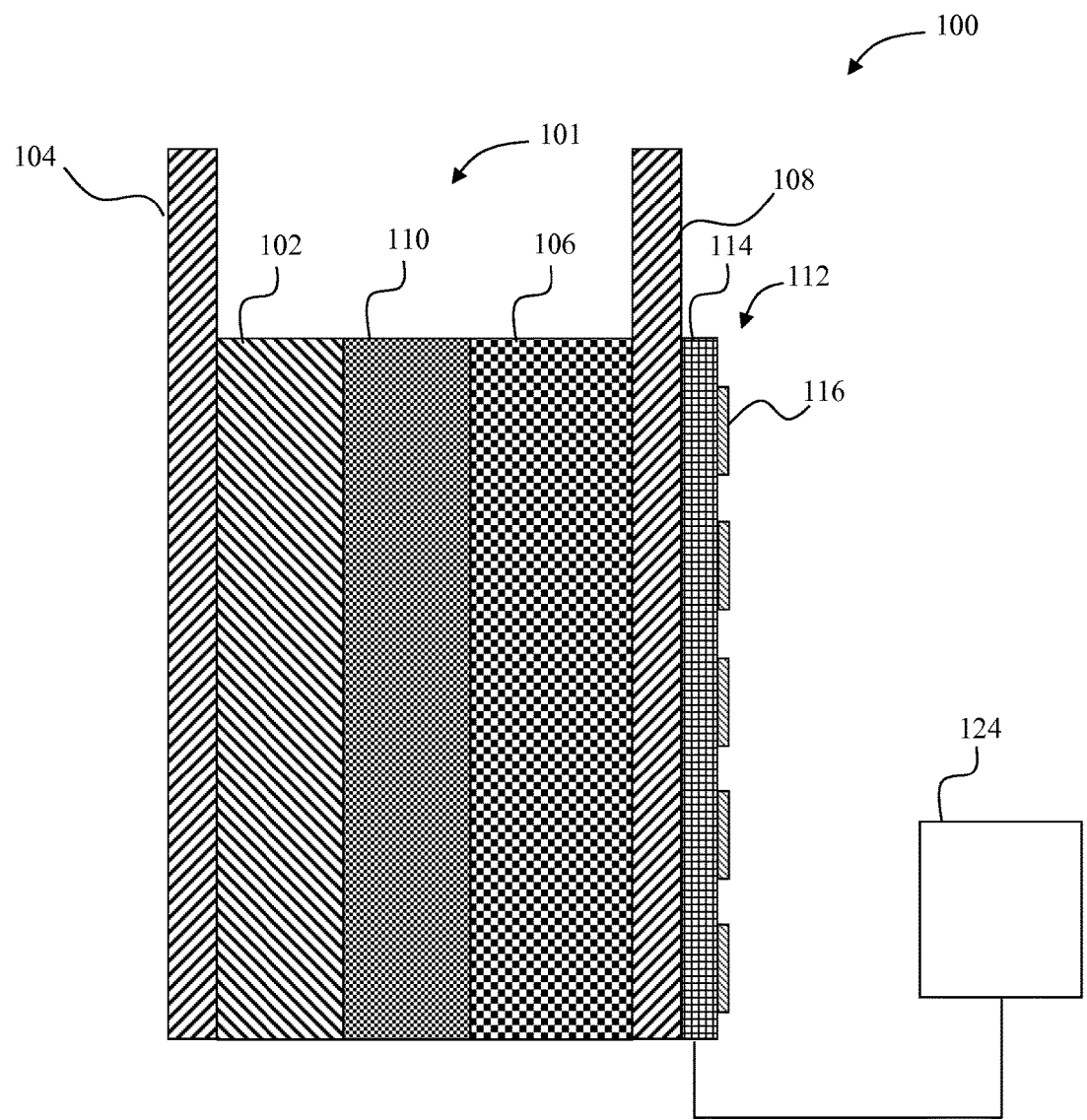
FIG. 1 depicts a simplified schematic of an electrochemical cell in a system including a monitoring system which can indicate the onset of potentially catastrophic failure of the electrochemical cell.

For the purpose of promoting an understanding of the principles of the disclosure, reference will now be made to the embodiments illustrated in the drawings and described in the following written description. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 depicts a battery system 100 including an electrochemical cell 101 which includes an anode 102 with a copper current collector 104, a cathode 106 with an aluminum current collector 108, and a separator 110. The anode 102 in this embodiment includes lithium metal or a lithium alloy metal. The anode 102 is sized such that it has at least as much capacity as the cathode 106, and preferably at least 10% excess capacity and in some embodiments up to 50% excess capacity at beginning of life and full charge to account for Li metal that may be consumed in side reactions that take place during cycling.

The cathode 106 in one embodiment only includes an active Li-insertion material. In various embodiments the cathode 106 includes a sulfur or sulfur-containing material (e.g., PAN—S composite or $Li_2S$); an air electrode; Li-insertion materials such as NCM, $LiNi_{0.5}Mn_{1.5}O_4$, Li-rich layered oxides, $LiCoO_2$, $LiFePO_4$, $LiMn_2O_4$; Li-rich NCM, NCA, and other Li intercalation materials, or blends thereof or any other active material or blend of materials that react with and/or insert Li cations and/or electrolyte anions. The cathode 106 may include Li-conducting polymer, ceramic or other solid, non-polymer electrolyte. The cathode Li-insertion materials may additionally be coated (e.g., via spray coating) with a material such as $LiNbO_3$ in order to improve the flow of ions between the Li-insertion materials and the solid electrolyte, as described in T. Ohtomo et al., Journal of Power Sources 233 (2013) 231-235.

Solid electrolyte materials in the cathode 106 may further include lithium conducting garnets, lithium conducting sulfides (e.g., $Li_2S$—$P_2S_5$) or phosphates, $Li_3P$, LIPON, Li-conducting polymer (e.g., PEO), Li-conducting metal-organic frameworks such as described by Wiers et al. "A Solid Lithium Electrolyte via Addition of Lithium Isopropoxide to a Metal-Organic Framework with Open Metal Sites," Journal of American Chemical Society, 2011, 133 (37), pp 14522-14525, the entire contents of which are herein incorporated by reference, thio-LISiCONs, Li-conducting NaSICONs, $Li_{10}GeP_2S_{12}$, $Li_{7-x}La_3Ta_xZr_{2-x}O_{12}$, wherein $0 \leq X \leq 2$, lithium polysulfidophosphates, or other solid Li-conducting material. Other solid electrolyte materials that may be used are described in Christensen et al., "A critical Review of Li/Air Batteries", Journal of the Electrochemical Society 159(2) 2012, the entire contents of which are herein incorporated by reference. Other materials in the cathode 106 may include electronically conductive additives such as carbon black, and optionally a binder to improve the coherence of the particles in the cathode (such as PVDF). The cathode materials are selected to allow sufficient electrolyte-cathode interfacial area for a desired design.

The separator 110 conducts Li ions but not electrons. The separator 110 may be composed of a solid Li conductor (such as ceramics, a garnet material, $Li_3N$, LiPON, LiSICON, LTAP, sulfides, and others including those described in for the cathode 106, a composite solid electrolyte including crystalline and glassy ceramics, and polymers such those based on polyethylene oxide).

A flexible sensor assembly in the form of a 2D sensor foil 112 is located on the outer surface of the cathode current collector 108. The 2D sensor foil 112, also shown in FIG. 2, includes a flexible substrate 114 and an array of magnetic field sensing sensors or pixels 116. As used herein, the term "array" when describing sensors or sensing pixels means at least two sensors/sensing pixels arranged in a predetermined pattern. The flexible substrate 114 in different embodiments is a plastic or a polymer. The array of sensors 116 is printed and contacted as individual pixels on the flexible substrate 114 by means commonly used for printed electronics. While hall sensors, TMR sensors or flux gate sensors are common types of sensitive magnetic field sensors, such known sensors are typically inflexible because they consist of brittle materials (oxide layer in TMR cells for instance) or require a defined geometry (fluxgate) that cannot be integrated in an electrode stack of an electrochemical cell like a battery or a capacitor. Attachment of a sensor to the battery case would be too remote in order to reliably detect small local currents in the cell at high resolution. Thus, in contrast to the 2D sensor foil 112, other known magnetic field sensors do not allow close integration (e.g. by lamination) into or onto an electrochemical cell stack or other irregular/bendable objects.

FIG. 3 depicts one example of a sensor 116 in the form of an organic pn-junction. The sensor 116 includes an electron injection layer 118, an organic semiconductor 120, which can be for example PPH-MEV, and a hole injection layer 122 which is made from a high work function material such as Pt and Ir. Each sensor 116 is about 1 μm to 10 μm square as viewed from the top as in FIG. 4. In some embodiments, the dimensions are scaled for particular applications. The sensors 116 make use of an magneto (OMR) effect in a spin valve as described by M. Gruenewald et al., "Large room-temperature magnetoresistance in lateral organic spin valves fabricated by in situ shadow evaporation" Org. Elec. 14, 2082 (2013). Some materials assembled as organic p-n junctions show nuclear magnetic resonance (NMR) in addition to the OMR as described by W. J. Baker. et. al., "Robust absolute magnetometry with organic thin-film devices", Nature Comm. (2012).

Figure 5:
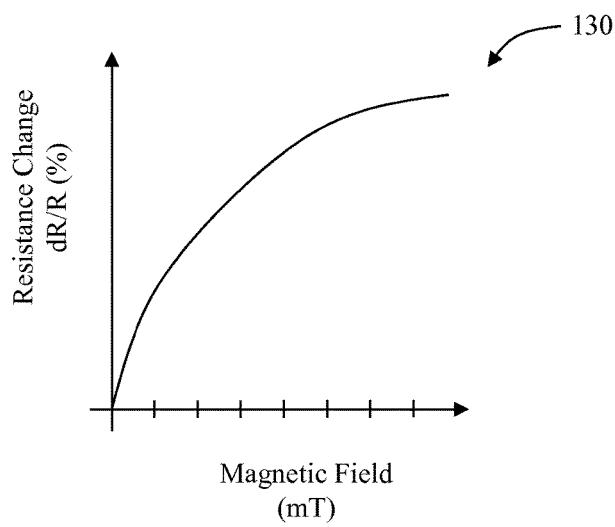
FIG. 5 depicts a graph of the output of the sensor of FIG. 3 with respect to a sensed magnetic field.

The organic magneto resistance (OMR) effect results in an output behavior depicted in FIG. 5. As indicated by the chart 130, as the magnetic field increases, the resistance change dR/R of each sensor 116 increases. The additional NMR effect in organic p-n junctions (under RF radiation of defined frequency of several 10 MHz to 100 MHz provided by the BMS or an ASIC for example) creates a peak/spike in the dR/R curve (spike not shown in FIG. 5) at a magnetic field value that is fundamentally related to the RF frequency. This can be used to calibrate the measured signal from time to time to achieve absolute values with high accuracy. Semiconductor materials which are used in the sensors 116 include Poly (2-methoxy-5-(2-ethylhexyloxy)-p-phenylene vinylene), Tris (8-ydroxyquinolinato)aluminum, and N,N-bis (heptafluorobutyl)-3,4:9,10-perylene diimide or (TMTSF)2PF6 and combinations, blends or mixtures thereof. Any other polymer/organic semiconductor can be used that shows a sufficient OMR effect (typically dR/R>10%).

The output of the sensors 116 is provided to a battery management system (BMS) 124 (see FIG. 1). The BMS 124 includes a memory (not shown) in which program instructions are stored, and a processor (not shown). The processor is operatively connected to each of the individual sensors 116 and executes the program instructions to map the current distribution of a given electrode or similar object within an electrochemical cell in situ. This provides invaluable information about the cell state and enables a BMS of unprecedented accuracy and capability.

Figure 6:
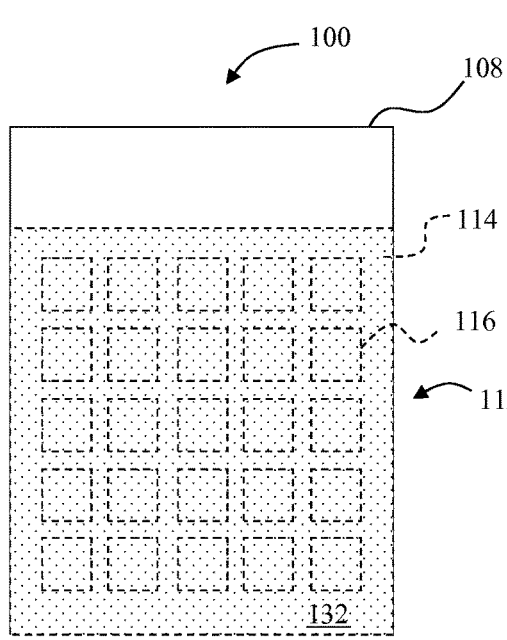
FIG. 6 depicts a simplified schematic of the cell of FIG. 1 looking at the current collector from the side adjacent to the cathode with shading to indicate a uniform current density.

For example, FIG. 6 depicts a simplified schematic of the cell 101 looking at the current collector 108 from the side adjacent to the cathode 106. The portion of the current collector 108 covered by the cathode 106 is uniformly shaded to identify a uniform current density 132 within the cathode 106. Because the current density is uniform, a uniform magnetic field will be created, thus the sensor 116 will provide a substantially uniform output. Some variation will occur since the outermost sensors 116 will not be influenced to the same extent as the innermost sensors 116. This variation, however, is mapped during initial calibration and stored in the memory.

Figure 7:
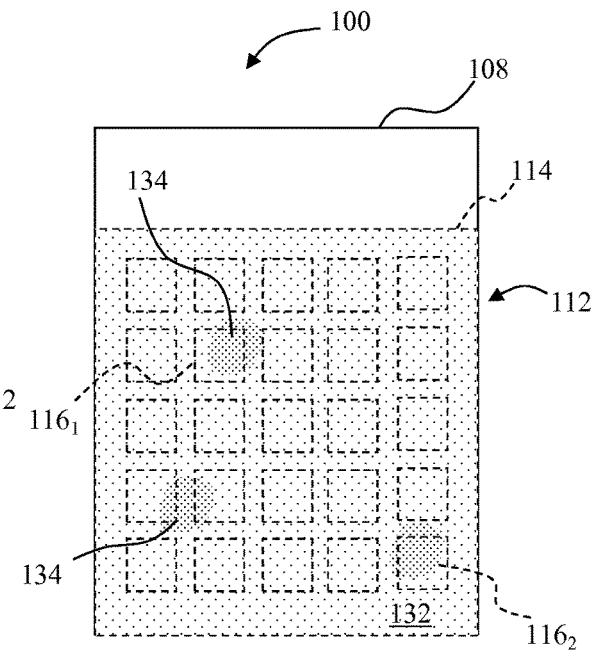
FIG. 7 depicts a simplified schematic of the cell of FIG. 1 looking at the current collector from the side adjacent to the cathode with shading to indicate a uniform current density interrupted by areas of increased current density.

FIG. 7 depicts the same view as FIG. 6. The difference is that the otherwise uniform current density 132 is interrupted with localized areas of higher current density 134. Accordingly, the sensors 116 in the vicinity of the higher current density 134, such as the sensor $116_1$ and the sensor $116_2$ will be subjected to a larger magnetic field, and thus provide a higher current output.

The processor within the BMS 124 executes the program instructions to analyze the current distribution based upon the input from the sensors by using a matrix $\bar{\rho}$ of measured values. By way of example, for a matrix of twelve sensors 116, each matrix element $\rho_i$ ($\{\rho_1 \ldots \rho_k \ldots \rho_n\}$ with n=12 in this example) corresponds to a magnetic field value measured at the position of the respective sensor pixel. This matrix is set forth below:

$$\bar{P}_0 = \begin{pmatrix} P_1 & P_2 & P_3 \\ P_4 & P_5 & P_6 \\ P_7 & P_8 & P_9 \\ P_{10} & P_{11} & P_{12} \end{pmatrix} \bigwedge P_1 \ldots P_K \ldots P_{12}$$

In the unperturbed case of an ideally homogeneous electrode, the magnetic field value at each point is proportional to the current density $\rho_0=I_0/A$, where "$I_0$" is the total current flowing through the electrode (the cathode 106 in the embodiment of FIG. 1) and "A" is the electrode area. It follows for each matrix element $\rho_i \epsilon \{\rho_1 \ldots \rho_k \ldots \rho_n\} \rightarrow \rho_i = \rho_0$ and hence $\bar{\rho} = \bar{\rho}_0$.

When local changes of the electrode's electronic and/or ionic properties occur due to chemical changes caused by degradation, side reactions, aging, mechanical and thermal stresses, electric fields etc. . . . the local current density ρ will change at a position "x" (P5 for example) and the corresponding matrix element $\rho_x$ of the sensor array will have a value $\rho_x = x\rho_0$ where $x \neq 1$. Since the total current $I_0$ through the electrode must be conserved in the simplest case of no additional leakage currents another matrix element $\rho_y$ ($P_{10}$ in this example) must have a value $\rho_y = y\rho_0$ where $y \neq 1$ and $x/2 + y/2 = 1$ is maintained. For the general case of k changed matrix elements $\rho_k \in \{\rho_1 \ldots \rho_n\}$ follows $\rho_k = x_i \rho_0$ with $$x_i \neq 1 \wedge \sum_{i=1}^{k} \frac{x_i}{k} = 1.$$

The matrix $\bar{\rho}$ becomes $\bar{\rho}_{in\ hom}$ in this case of an inhomogeneous current distribution. The output of the sensors 116 is thus used to identify variations in magnetic flux which indicate changes in current density within the cell 101.

While FIG. 1 depicts the 2D sensor foil 112 positioned on the current collector 108, in other embodiments the 2D sensor foil 112 is positioned on the current collector 104. In further embodiments, the 2D sensor foil 112 is positioned on both current collectors 104 and 108.

Figure 8:
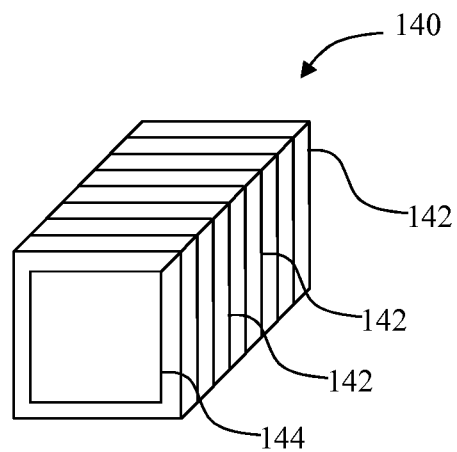
FIG. 8 depicts an embodiment of a battery stack with a single sensor used to monitor a stack of cells.
Figure 9:
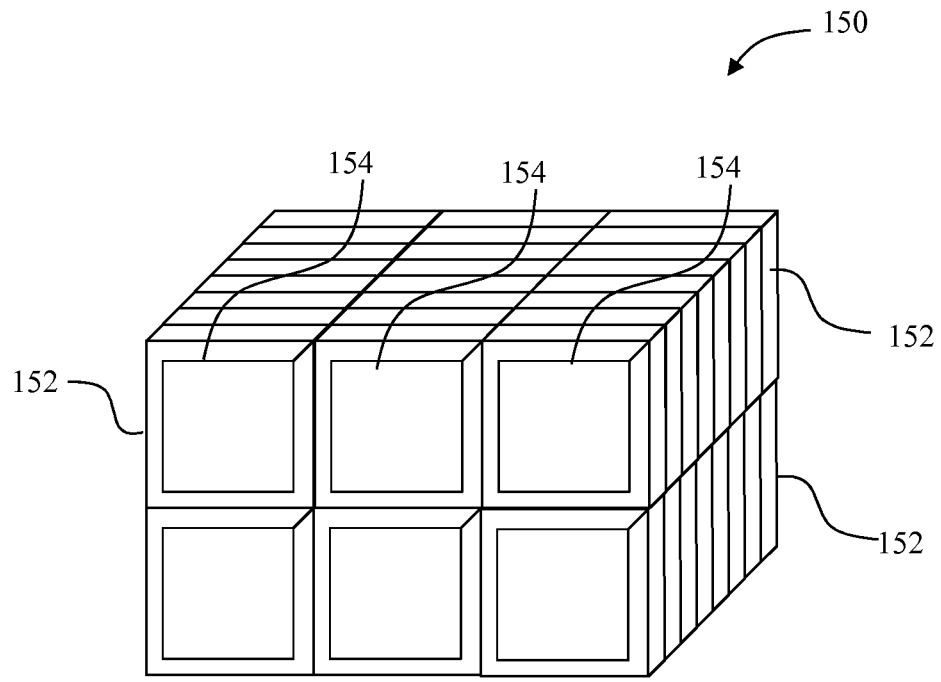
FIG. 9 depicts an embodiment of a number of parallel battery stacks each with a single sensor used to monitor a stack of cells within the respective stack.

Moreover, while a particular array of sensors 116 has been depicted, arrays of other sizes can be used for particular embodiments. For example, FIG. 8 depicts a battery stack 140 that includes a number of cells 142 which in one embodiment numbers about 100. The cells 142 in one embodiment are thin-film cells with an array of a single sensor 144 which is like the sensor 116. Thus, a single sensor 144 monitors a plurality of cells 142. FIG. 9 depicts an embodiment of a parallel package 150 of battery stacks 152, each of which is provided with a sensor 154. If necessary each individual cell can be equipped with a sensor or sensor array in this stack or pack context.

Additionally, while described with respect to a particular type of electrochemical cell, the sensors described herein may be incorporated into any type of device which produces magnetic fields including flow batteries and capacitors.

In accordance with the disclosed embodiments, electric currents can be used to detect short-circuit currents in Li-Ion batteries. Early and reliable detection of those currents can be used as a feedback for a battery management system (BMS) to prevent catastrophic failure of a battery or other device. To this end, the BMS controls charging and discharging of the battery based upon the detection of changes in magnetic flux. For example, a deep discharge of an electrochemical cell may be effected so as to reduce the effects of dendrites.

Accordingly, a flexible 2D magnetic field sensor with high sensitivity is provided that in various embodiments is included in an electrochemical cell (battery, capacitor, fuel cell or similar) to monitor current distributions in situ.

In order to detect short circuits (i.e. small currents) in an electrochemical cell or to map local current distributions, the present disclosure provides a flexible cheap and sensitive sensor technology. The described embodiments provide a magnetic field sensor with superior sensitivity (field sensitivity of 50 nT/Hz$^{1/2}$) that in some embodiments is applied by solution based film coating, printing or evaporation and can therefore be integrated in the cell or other device directly. Furthermore disclosed embodiments allow online calibration for absolute value determination independent of noise/interference due to external fields (earth field, stray fields of power lines etc. . . . ) by using fundamental relations of nuclear magnetic resonance (NMR) due to interaction of conduction electrons and nuclear spins of the material.

Thus, a magnetic field is detected by measurement of the electric resistance through a pn-junction or spin valve made of an organic semiconductor which has a magnetic field-dependent electrical resistance (e.g. caused by spin-dependent decay of polarons into excitons in some materials). The described embodiments combine high sensitivity with low-cost and easy-to-process materials (CMOS integration possible for example) to monitor variations (both increases and decreases) in the magnetic field.

In addition to short-circuit detection in an electrochemical cell the described embodiments can be used to determine the state-of-health of a battery directly, by comparing the measured absolute magnetic field distribution (i.e. current density distribution) to a reference value stored in the battery management system (BMS) for a given cell or electrode or stack area. Local changes of the cell resistance can be tracked over time and the operation strategy can be adapted to maximize cell life, usable capacity and maintain safety at each state of the system.

The disclosed embodiments provide integration of a magnetic field/current sensor directly in the electrode laminates of an electrochemical cell which in various embodiments are formed by inexpensive low-temperature coating or printing processes (comparable to coating with lithography resists).

The disclosed embodiments are mechanically flexible and adaptable to irregular shapes. In addition to regular measurements of fields caused by electronic currents, the disclosed embodiments can detect the magnetic field of ion currents in electrochemical cells because the sensors are positioned so close to the cell components. The disclosed embodiments in some applications exhibit high sensitivity/resolution of up to 50 nT/Hz$^{1/2}$ which allows detection of very small currents.

Unlike other sensitive magnetic field sensors, there is no strong limitation to ultra-low fields (despite the high potential sensitivity, operation at higher fields (>>10 mT) possible) with the devices described above. The disclosed embodiments can be extended to a 2D-array of many sensor pixels to allow 2D-mapping of current distribution over an electrode area and even over irregular shapes.

The disclosed embodiments are easily integrated into a manufacturing process since a small number (3-4) of process steps are required. Specifically, forming a functional organic semiconductor layer, two contact layers and optionally an encapsulation layer.

Unlike conventional magnetic field sensors, the integration of the disclosed embodiments in CMOS processes for non-battery applications (i.e. ASICs for consumer sensors, automotive sensors . . . ) is easier due to a process that is similar to well established coating of lithography polymer resist.

Finally, the disclosed embodiments can be used for monitoring of solid state thin-film batteries in automotive or mobile applications. The magnetic field sensor design and read-out method descried above for current monitoring can be used for various kinds of automotive, industrial, energy and consumer applications where low costs, mechanical flexibility, coverage of irregular shapes, high sensitivity are important for magnetic field or indirect current measurements.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A battery system, comprising:
   an electrochemical cell;
   a flexible sensor assembly attached to the cell, the flexible sensor assembly including an array of spin valve magnetic field sensors exhibiting an organic magneto resistance effect; and
   a battery management system operably connected to the flexible array, the battery management system including a memory with program instructions stored therein, and a processor operably connected to the memory and to the array, the processor configured to execute the program instructions to identify local changes in magnetic flux using input from the array of magnetic field sensors, wherein each of the magnetic field sensors comprises an organic p-n junction.

2. The system of claim 1, wherein each of the magnetic field sensors exhibits an organic magneto resistance change (dR/R) of greater than 10%.

3. The system of claim 1, wherein:
   the flexible sensor assembly includes a flexible substrate; and
   the flexible substrate is attached to a cathode current collector of the electrochemical cell.

4. The system of claim 3, wherein the processor is further configured to execute the program instructions to identify local changes in magnetic flux using a matrix ($\bar{\rho}$) of input values from the array of magnetic field sensors.

5. The system of claim 4, wherein the processor is further configured to execute the program instructions to control operation of the battery based upon the identified local changes in magnetic flux.

6. The system of claim 5, wherein the processor is further configured to execute the program instructions to determine a state-of-health of the electrochemical cell.

7. The system of claim 6, wherein the processor is further configured to execute the program instructions to determine the state-of-health of the electrochemical cell by comparing a measured absolute magnetic field distribution to a reference value stored in the memory.

8. A method of operating a battery system, comprising:
   discharging an electrochemical cell;
   sensing a plurality of discharging localized magnetic fluxes of the electrochemical cell using a flexible sensor assembly having a flexible substrate supporting an array of spin valve magnetic field sensors, each of which exhibit an organic magneto resistance effect, while discharging the cell;
   analyzing, by executing with a processor command instructions stored in a memory, the sensed plurality of discharging localized magnetic fluxes;
   controlling operation of the electrochemical cell by executing with the processor command instructions stored in the memory based upon the analyzed sensed plurality of discharging localized magnetic fluxes; and
   storing first data associated with a mapping of a plurality of initial localized magnetic fluxes of an electrochemical cell, wherein analyzing comprises:
   comparing the first data with data associated with the sensed plurality of discharging localized magnetic fluxes.

9. The method of claim 8, wherein sensing the plurality of discharging localized magnetic fluxes comprises:
   sensing the plurality of discharging localized magnetic fluxes using an array of spin valve magnetic field sensors including organic p-n junctions.

10. The method of claim 9, wherein sensing the plurality of discharging localized magnetic fluxes comprises:
    sensing the plurality of discharging localized magnetic fluxes using an array of spin valve magnetic field sensors exhibiting an organic magneto resistance change (dR/R) of greater than 10%.

11. The method of claim 9, wherein sensing the plurality of discharging localized magnetic fluxes comprises:
    sensing the plurality of discharging localized magnetic fluxes using an array of spin valve magnetic field sensors supported by a flexible substrate attached to a cathode current collector of the electrochemical cell.

12. The method of claim 11, wherein analyzing the sensed plurality of discharging localized magnetic fluxes comprises:
    executing the program instructions with the processor to identify local changes in magnetic flux using a matrix ($\bar{\rho}$) of input values from the array of spin valve magnetic field sensors.

13. The method of claim 12, further comprising:
    determining a state of health of the electrochemical cell using the analyzed sensed plurality of discharging localized magnetic fluxes by executing with the processor command instructions stored in the memory.

14. The method of claim 13, wherein determining the state of health comprises:
    comparing the first data with data associated with the sensed plurality of discharging localized magnetic fluxes.

15. The method of claim 8, wherein sensing a plurality of discharging localized magnetic fluxes further comprises:
    sensing the plurality of discharging localized magnetic fluxes of the electrochemical cell using a flexible sensor assembly having a flexible substrate supporting an array of spin valve magnetic field sensors, each of which exhibit an organic magneto resistance effect and a nuclear magnetic resonance, while discharging the cell.

16. The method of claim 15, further comprising:
    calibrating the sensed plurality of discharging localized magnetic fluxes using the nuclear magnetic resonance.

17. The system of claim 3, wherein the processor is further configured to execute the program instructions to perform a calibration based upon nuclear magnetic resonance of the array of spin valve magnetic field sensors.

* * * * *